United States Patent [19]
Yamauchi

[11] Patent Number: 5,422,297
[45] Date of Patent: Jun. 6, 1995

[54] METHOD FOR FORMING A SEMICONDUCTOR DEVICE

[75] Inventor: Yoshimitsu Yamauchi, Nabari, Japan

[73] Assignee: Sharp Kabushiki Kaisha, Osaka, Japan

[21] Appl. No.: 254,574

[22] Filed: Jun. 6, 1994

[30] Foreign Application Priority Data

Oct. 29, 1993 [JP] Japan .................. 5-272432

[51] Int. Cl.⁶ .................................. H01L 21/70
[52] U.S. Cl. .............................. 437/52; 437/41; 437/70
[58] Field of Search .......................... 437/41, 52, 70

[56] References Cited

U.S. PATENT DOCUMENTS

| | | | |
|---|---|---|---|
| 4,170,492 | 10/1979 | Bartlett et al. | 437/70 |
| 5,118,641 | 6/1992 | Roberts | 437/69 |
| 5,134,085 | 7/1992 | Gilgen et al. | 437/52 |
| 5,314,832 | 5/1994 | Deleonibus | 437/27 |

FOREIGN PATENT DOCUMENTS 5-218356  4/1993  Japan .
5-145082  7/1993  Japan .

Primary Examiner—Brian E. Hearn
Assistant Examiner—Trung Dang
Attorney, Agent, or Firm—Nixon & Vanderhye

[57] ABSTRACT

A method for forming a semiconductor device comprising steps of: (i) depositing an oxide film and then an anti-oxide film on a semiconductor substrate of a first conductive type, (ii) removing the anti-oxide film provided in a prescribed region where a field oxide film is to be formed, followed by forming a resist on the semiconductor substrate including the anti-oxide film in a prescribed region where a buried bit line is to be formed, (iii) implanting ions of a second conductive type to the semiconductor substrate using the oxide film and the resist as a mask, (iv) forming the field oxide film in the prescribed region by LOCOS method, followed by forming a gate electrode on the semiconductor substrate, (v) implanting ions of the second conductive type to the semiconductor substrate using the gate electrode as a mask and subjecting the resulting semiconductor substrate to a thermal treatment, thereby forming a source/drain region to which the buried bit line is connected.

7 Claims, 9 Drawing Sheets

METHOD FOR FORMING A SEMICONDUCTOR DEVICE

BACKGROUND OF THE INVENTION

1. Field of the Invention

The present invention relates to a method for forming a semiconductor device, in particular, a method for forming a semiconductor device in which a source and drain diffusion layer for a plurality of memory cell transistors is connected with a buried bit line.

2. Description of the Related Art

A method for forming a bit line connecting a plurality of memory transistors of a semiconductor device, as a diffusion layer formed in a semiconductor substrate, has been conventionally developed.

An example of a device manufactured by the conventional method is shown in FIG. 9 and FIG. 10. In the device, an active region 22 is formed in a desired shape on a semiconductor substrate 21, and a gate electrode 23 is formed so as to cross at a right angle with respect to the active region 22. A bit line 24 is formed parallel to the gate electrode 23 by a diffusion layer to connect each transistor formed on the active region 22. A device isolation film 25 is formed in the region where the active region 22 and the bit line 24 are not formed and a thin oxide film 29 is formed over the bit line in the active region.

In case of forming a memory cell having a structure described above, a thick insulating film is formed on the semiconductor substrate 21 as the device isolation film 25 to define the active region 22 and a bit line 24 formation region. Subsequently, the gate electrode 23 is formed. A bit line 24 and source/drain region are formed by implanting ions simultaneously by using the gate electrode 23 and the device isolation film 25 as a mask.

However, as seen from FIG. 11, there is a possibility that the gate electrode 23 may not be correctly aligned with the bit line 24 formation region, overlapping the bit line 24 formation region. If the overlapping occurs, as shown in FIG. 12, the channel region under the gate electrode 23 is in contact with the bit line 24 formation region in the region 100 so as to connect each of the transistors aligned in a bit line. To avoid overlapping, a margin Y of the alignment (see FIGS. 9 and 10) is required between the gate electrode 23 and the bit line 24 formation region. However, retaining the margin Y of alignment causes an increase in cell area. Therefore, there is a drawback that the cell can not be miniaturized, while avoiding the overlapping.

Alternatively, another method is known in which a thick insulating film is formed on a bit line formation region as a device isolation film.

In this method, as shown in FIG. 13 and FIG. 14, a resist is formed by photolithography method in the region other than a buried diffusion layer 34 formation region, and a buried diffusion layer 34 is formed as a bit line by implanting ions using the resist as a mask. After removing the resist, an oxide film and anti-oxide film are formed and the anti-oxide film is removed except for the region on the active region 32. Then, the oxide film is oxidized, thereby forming a device isolation film 35 in the region except for the active region 32 which includes a thin oxide film 39 as shown in FIGS. 15 and 16. Subsequently, a gate electrode 33 is formed on the active region 32 and the device isolation film 35 positioned as generally indicated in FIGS. 13 and 14. Source/drain is formed by implanting ions using the gate electrode 33 as a mask.

According to the method, as shown in FIG. 15, which is a sectional view along line B—B' of FIG. 13, since the resist used as a mask for the buried diffusion layer and the anti-oxide film for forming the device isolation film 35 are formed separately, the buried diffusion layer 34 may extend beyond from under the device isolation film 35 to the active region 32 when the resist and the device isolation region are not aligned correctly. If the gate electrode 33 overlaps thereon as shown in FIG. 16, which is a sectional view along line C—C' of FIG. 13, the buried diffusion layer 34 is formed in the channel region under the gate electrode 33. As a result, the characteristics of transistor may be adversely affected and there is a fear that the buried diffusion layer 34 is connected with both of the source and drain diffusion layer 41 in a transistor. Therefore, minimization of a device can not be achieved with a high quality by this method.

SUMMARY OF THE INVENTION

The present invention provides a method for forming a semiconductor device comprising steps of:

(i) depositing an oxide film and then an anti-oxide film on a semiconductor substrate of a first conductivity type, (ii) removing the anti-oxide film provided in a prescribed region where a field oxide film is to be formed, followed by forming a resist on the semiconductor substrate including the anti-oxide film in a prescribed region where a buried bit line is to be formed, (iii) implanting ions of a second conductivity type to the semiconductor substrate using the oxide film and the resist as a mask, (iv) forming the field oxide film in the prescribed region by LOCOS method, followed by forming a gate electrode on the semiconductor substrate, (v) implanting ions of a second conductivity type to the semiconductor substrate using the gate electrode as a mask and subjecting the resulting semiconductor substrate to a thermal treatment, thereby forming a source/drain region to which the buried bit line is connected.

An object of the present invention is to provide a method of forming a semiconductor device by which cell area can be reduced without providing an alignment margin, while keeping the contact between each transistor of memory cells and a bit line.

PREFERRED EMBODIMENT OF THE INVENTION

Figure 1:
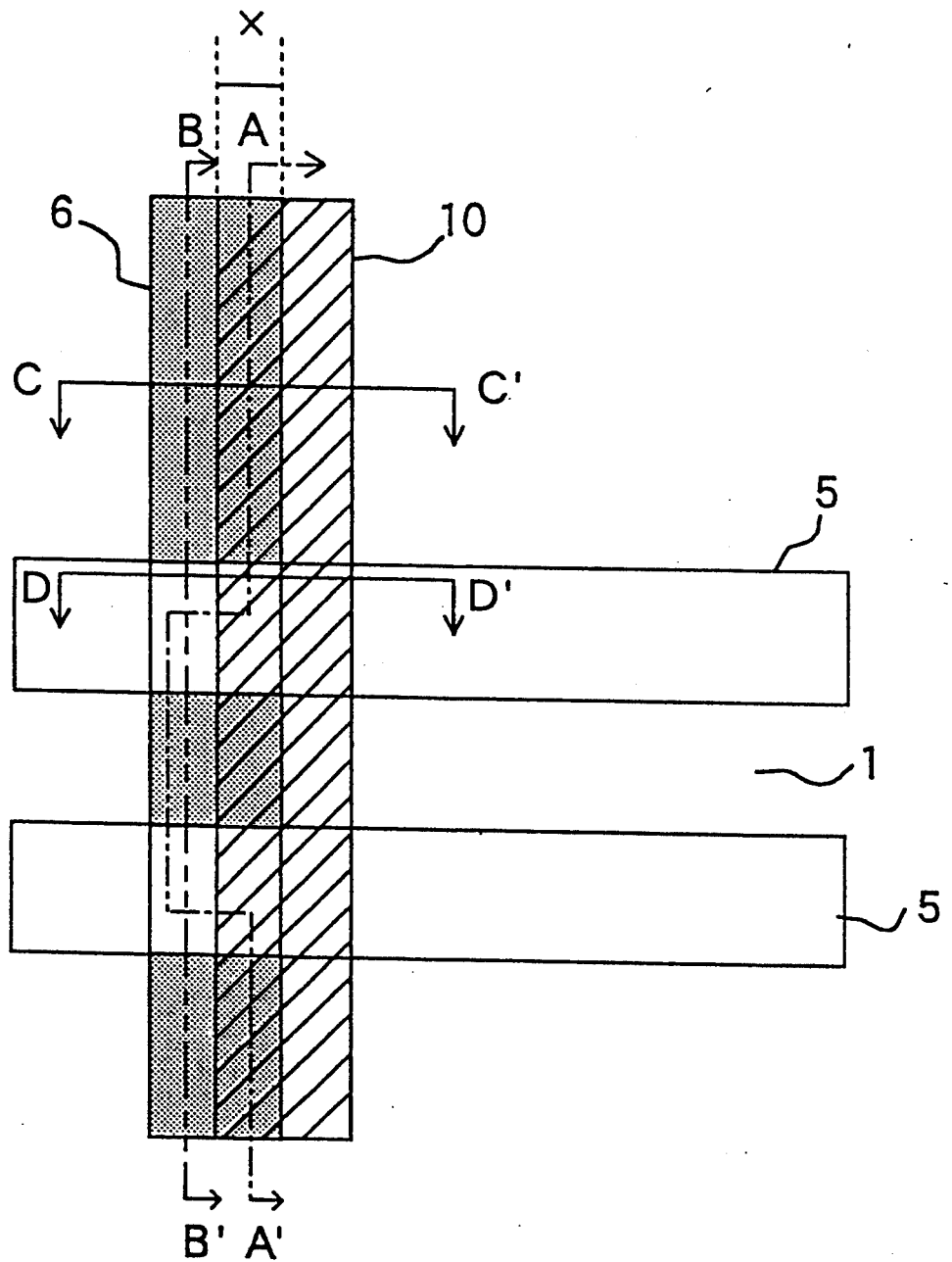
FIG. 1 is a schematic plan view for of a semiconductor device according to the present invention.

A semiconductor substrate for the present invention is not specifically limited, so far as it can be used for memory and the like. But, a silicon substrate is preferably used. Irrespective of the conductivity type of the substrate, whether it is P type or N type, substantially the same effect can be exhibited. When P type substrate is used, a source/drain region and a buried diffusion layer are formed with N type, and when N type substrate is used, the source/drain region and the buried diffusion layer are formed with P type.

In step (i), an oxide film and then an anti-oxide film are formed on the semiconductor substrate of a first conductivity type by a known method. As the oxide film, $SiO_2$ film is preferably used, and as the anti-oxide film, silicon nitride is preferably used, respectively.

In step (ii), the anti-oxide film in the region where a field oxide film is to be formed is removed by a known method, for example by etching such that the anti-oxide/ oxide film remains only on the active region.

Next, a resist is formed on the semiconductor substrate including the anti-oxide/oxide film. The resist has an opening in the region where a buried diffusion layer is to be formed in a later step. A known method, for example, photolithography method and etching method are used for forming a resist on the semiconductor substrate in a desired shape. Accordingly, a mask having an opening in the region where the buried diffusion layer is to be formed in the field oxide film formation region is formed with the anti-oxide film and resist.

In step (iii), ions of a second conductivity type are implanted to the semiconductor substrate using the anti-oxide film and resist as a mask. The conductive type of the ion to be implanted is different from that of the semiconductor substrate. In case of using P type substrate, As or P ions are implanted, and in case of using N type substrate, B or In ions are implanted. It is preferable to implant ions at the dose of about $1 \times 10^{14}$ to $1 \times 10^{16}$ ions/$cm^2$. At this time, ions may be implanted simultaneously for preventing a field reversal.

In step (iv), a field oxide film is formed e.g., by LOCOS method. In this case, thermal oxidation is conducted to the oxide film under conventional conditions. The field oxide film is preferably formed to have a thickness of about 1,000 angstroms or more.

Next, after removing the anti-oxide film, a gate oxide film is formed to have a thickness of about 100 to 500 angstroms on an active region. A gate electrode is formed on the semiconductor substrate on which the active region is defined by forming the field oxide film. Material for the gate electrode of the present invention is not especially limited. Any material generally used for the gate electrode of transistors may be used. For example, polysilicon, silicide, polyside and the like may be used. In the case of using polysilicon, the gate electrode is formed by a known method, for example, CVD method and the like, preferably with a thickness of about 1,000 to 5,000 angstroms, followed by patterning by a known method, thereby obtaining the gate electrode with a desired shape.

In step (v), a source/drain region is formed by ion implantation using the gate electrode and the field oxide film as a mask. The ions to be implanted have a different conductivity type from the semiconductor substrate. In case of using P type substrate, it is preferred to implant As ions or both of As and P ions (double implantation), while in case of using N type substrate, it is preferred to implant B and In ions. The dose is preferably in the range of about $1 \times 10^{14}$ to $1 \times 10^{16}$ ions/$cm^2$. Subsequently, thermal treatment is subjected at about 800° C. to 1,000° C., for example, under nitrogen atmosphere, thereby obtaining the source/drain region.

In the present invention, a thermal treatment can be conducted between the step (iii) and (iv). A thermal treatment for the resulting substrate is conducted, for example, at about 800° C. to 1,000° C. to form the buried diffusion layer under the region where the field oxide film is to be formed after the resist layer is removed. A side wall spacer may be formed with an insulating film, e.g., $SiO_2$ film and the like on the side wall of the anti-oxide film which is used as a mask. In the case of using the anti-oxide film formed on the side wall spacer as a mask, even when the width of a bird's beak of the field oxide film, which is to be formed in a later step, is made narrow in accordance with miniaturization of a device, the buried diffusion layer and channel region are kept in an offset state.

In step (v),

As described above, according to the method of the present invention, the buried diffusion layer is formed, to which the source/drain region of each transistor of memory cell is connected. Further, the offset width between the buried diffusion layer and the channel region of the transistor is sufficiently retained.

A method of the present invention is described in detail with reference to examples as follows.

EXAMPLE 1

Figure 2:
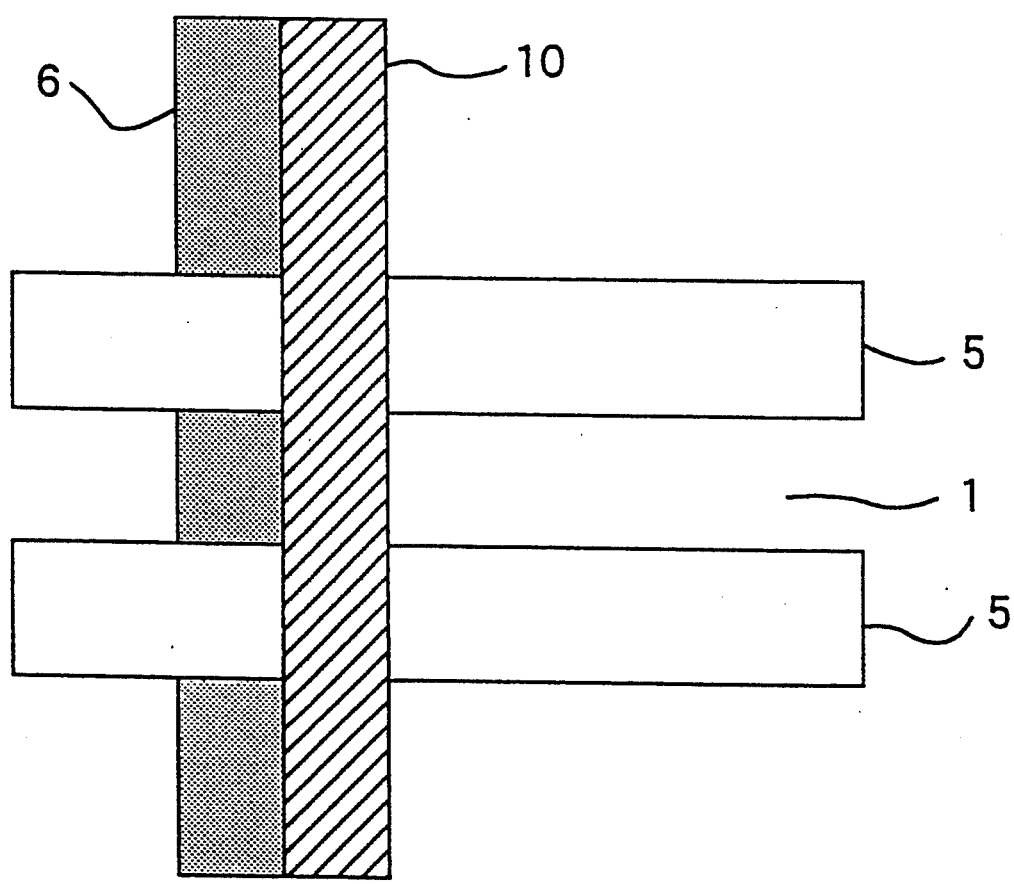
FIG. 2 is another schematic plan view of a semiconductor device according to the present invention.

As shown in FIGS. 1 and 2, an active region 5 was defined on a P-type Si substrate 1, and a gate electrode 10 was formed so as to cross the active region 5 at a right angle. A buried diffusion layer 6 was formed in parallel with the gate electrode 10 seen from the top, thereby connecting with each of transistors provided on the active region 5. Incidentally, FIG. 1 shows a plan view in the case that the buried diffusion layer 6 and gate electrode 10 are mismatched in a width of X, while FIG. 2 shows a plan view in the case that there is no such a mismatch and the gate electrode 10 is aligned with the buried diffusion layer 6.

Figure 3:
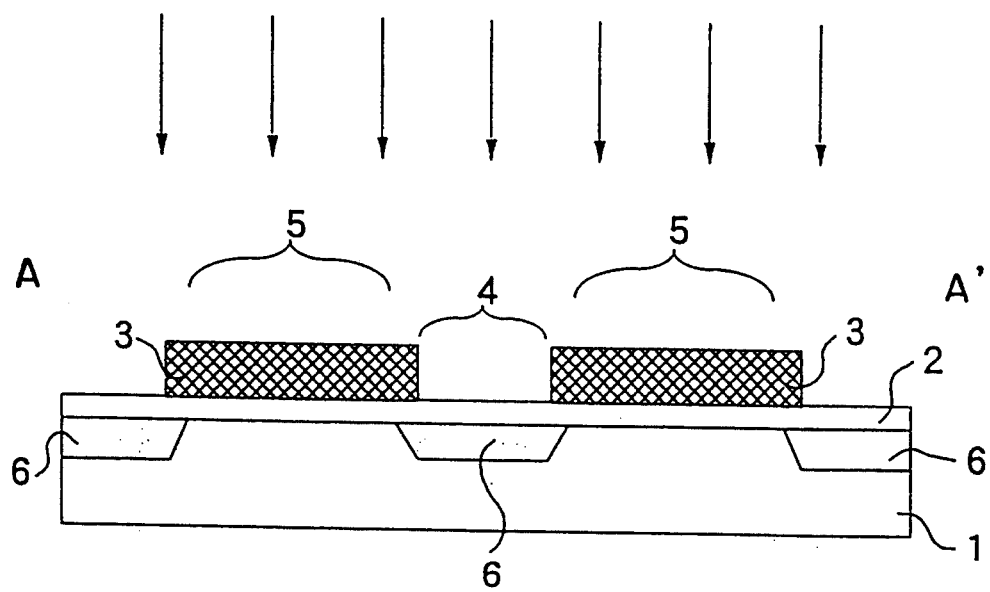
FIG. 3 is a cross sectional view of a semiconductor device in a first step of an example of the present invention, which is taken along line A—A' of FIG. 1.

The method for forming a semiconductor device having the above structure is now described with reference to FIG. 3. FIG. 3 is a cross sectional view taken along line A—A' of FIG. 1.

On a P type Si substrate 1, SiO$_2$ film 2 and silicon nitride film 3 were formed for an oxide film and anti-oxide film, with a thickness of about 600 angstroms and about 1,200 angstroms, respectively. Next, as shown in FIG. 3, the SiN film 3 provided on a field oxide film formation region 4 was removed by photolithography method such that a silicon nitride/SiO$_2$ film was formed only on the active region 5. After implanting B ions at a dose of about $7 \times 10^{13}$ ions/cm$^2$ in order to reduce a field reversal voltage, a resist layer was deposited, thereby forming a resist pattern with an opening corresponding to the region of the buried diffusion layer 6. Then, As ions were implanted with 80 KeV at a dose of about $1 \times 10^{15}$ ions/cm$^2$ using the silicon nitride/SiO$_2$ film and the resist pattern as a mask, followed by thermal treatment at about 950° C. for about 60 minutes, thereby obtaining the buried diffusion layer 6.

Figure 4:
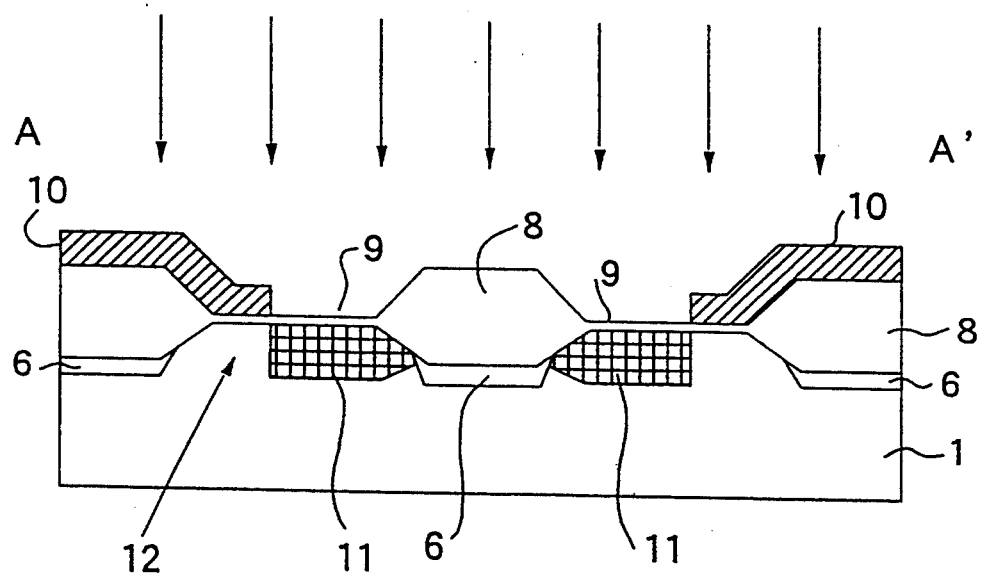
FIG. 4 is a cross sectional view of a semiconductor device in a second step of an example of the present invention, which is taken along line A—A' of FIG. 1.

Subsequently, as shown in FIG. 4, thermal oxidation was conducted by LOCOS method to form a field oxide film 8 with a thickness of about 6,000 angstroms in the field oxide film formation region 4. Then, a gate oxide film 9 with a thickness of about 170 angstroms was formed on the active region 5, and polysilicon was deposited with a thickness of about 2,000 angstroms. The polysilicon was patterned by photolithography method to a desired pattern, thereby forming a gate electrode 10. After implanting As ions with about 80 KeV at a dose of about $4 \times 10^{15}$ ions/cm$^2$ and P ions with about 40 KeV at a dose of about $5 \times 10^{14}$ ions/cm$^2$, respectively, thermal treatment at about 900° C. was conducted for about 30 minutes in nitrogen atmosphere to form source/drain region 11. The buried diffusion layer 6 was offset to the channel region 12 under the gate electrode 10 due to a bird's beak of the field oxide film 8, and was connected with the source/drain 11.

EXAMPLE 2

Figure 5:
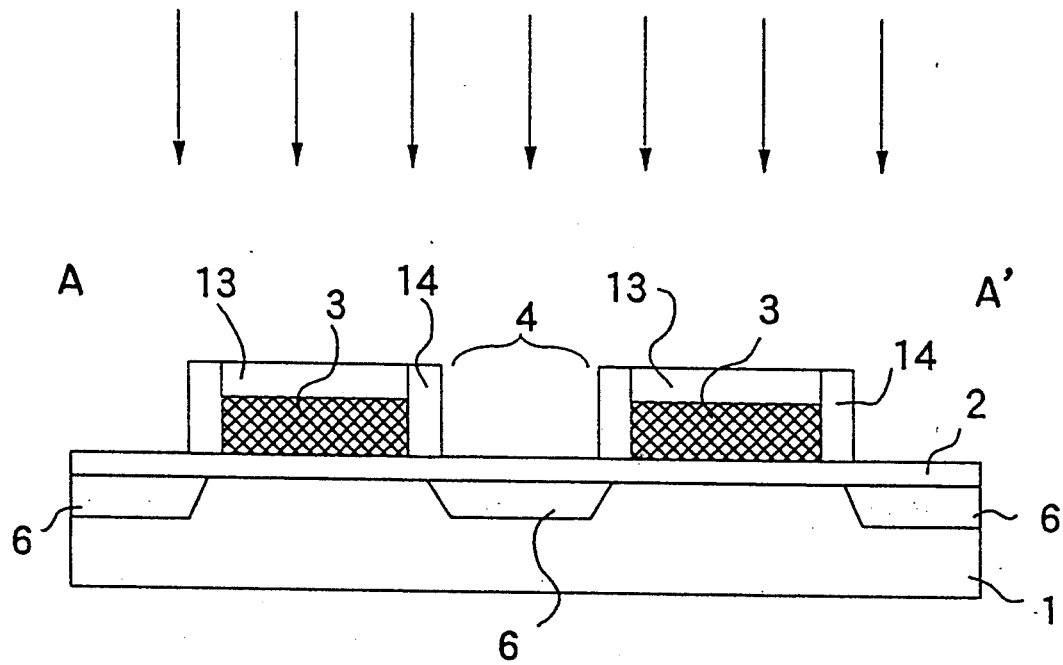
FIG. 5 is a cross sectional view of a semiconductor device in a third step of an example of the present invention, which is taken along line A—A' of FIG. 1.

In the same manner as Example 1, after depositing SiO$_2$ film 2 and silicon nitride film 3 on the P type Si substrate 1, SiO$_2$ film 13 was further deposited with a thickness of about 1,500 angstroms as shown in FIG. 5. Then, the SiN film 3 provided on the field oxide film formation region 4 was removed such that the SiO$_2$/silicon nitride/SiO$_2$ film was formed only on the active region 5. After forming SiO$_2$ film with a thickness of about 3,000 angstroms on the Si substrate 1 including the SiO$_2$ 13/silicon nitride 3 film, the surface was etched back and a side wall spacer 14 was formed on the side surface of the SiO$_2$ 13/silicon nitride 3 film.

Next, similar to Example 1, ion implantation was conducted for raising a field reversal voltage and for forming a bit line 6. Subsequent steps were the same as Example 1.

As described above, in case of forming the side wall spacer 14 for the buried diffusion layer 6 by using the silicon nitride film 3 as a mask, an offset width between the buried diffusion layer 6 and the channel region 12 under the gate electrode 10 is prevented from reducing and is kept in a certain width, even if the size of a device is further minimized.

Figure 7:
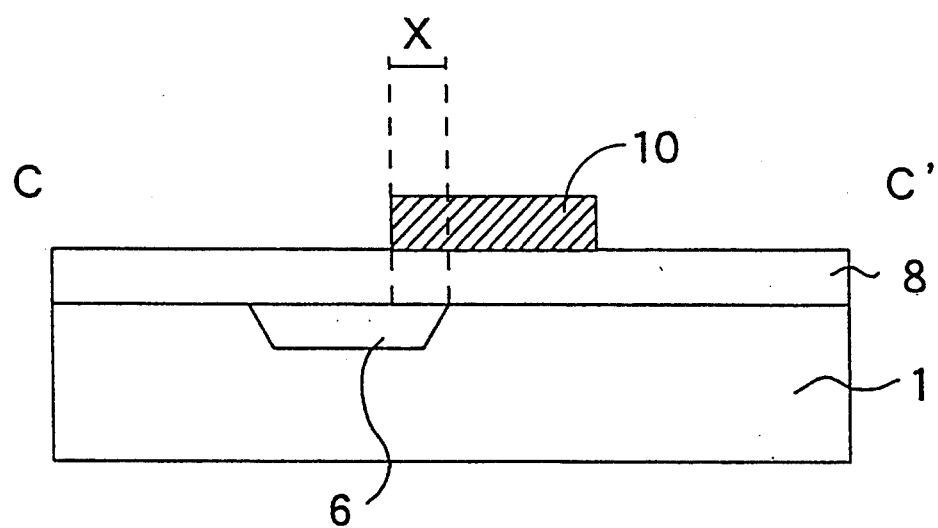
FIG. 7 is a cross sectional view of a semiconductor device according to the present invention, which is taken along line C—C' of FIG. 1.
Figure 8:
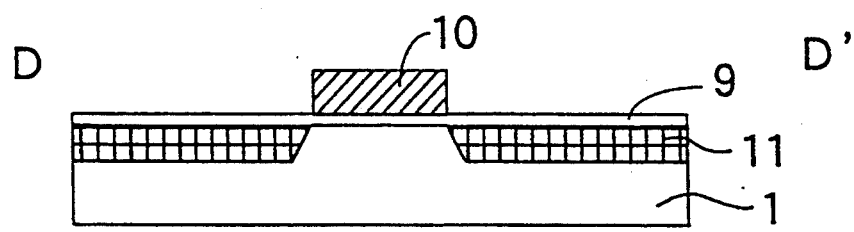
FIG. 8 is a cross sectional view of a semiconductor device according to the present invention, which is taken along line D—D' of FIG. 1.
Figure 9:
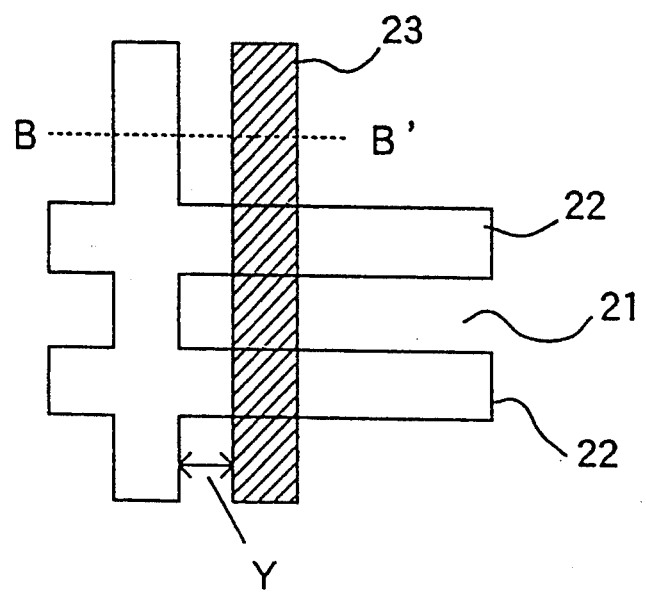
FIG. 9 is a schematic plan view of a conventional semiconductor device.
Figure 10:
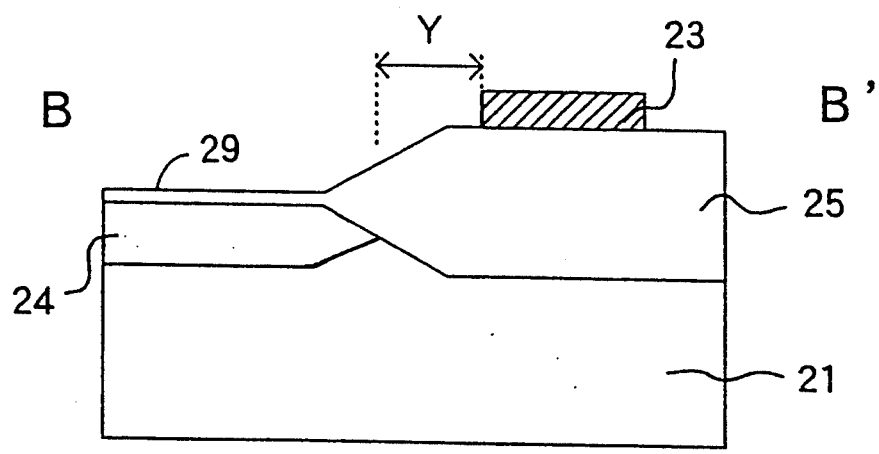
FIG. 10 is a cross sectional view taken along line B—B' of FIG. 9.
Figure 11:
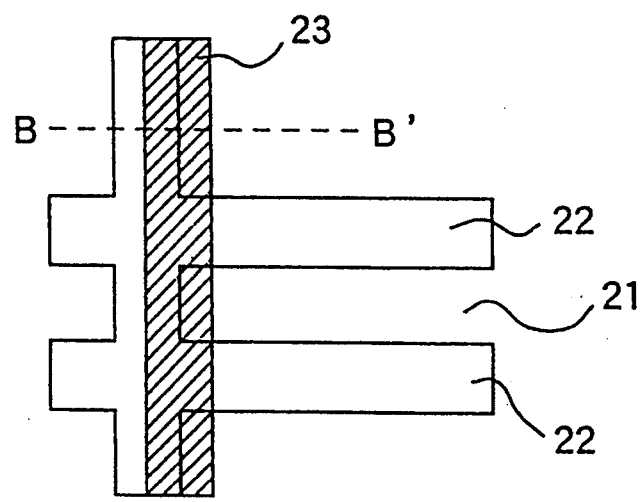
FIG. 11 is a schematic plan view of another conventional semiconductor device.
Figure 12:
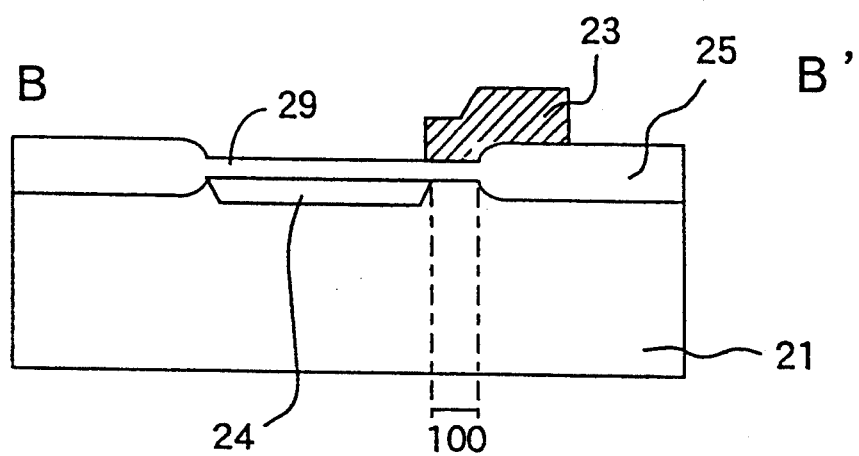
FIG. 12 is a cross sectional view taken along line B—B' of FIG. 11.
Figure 13:
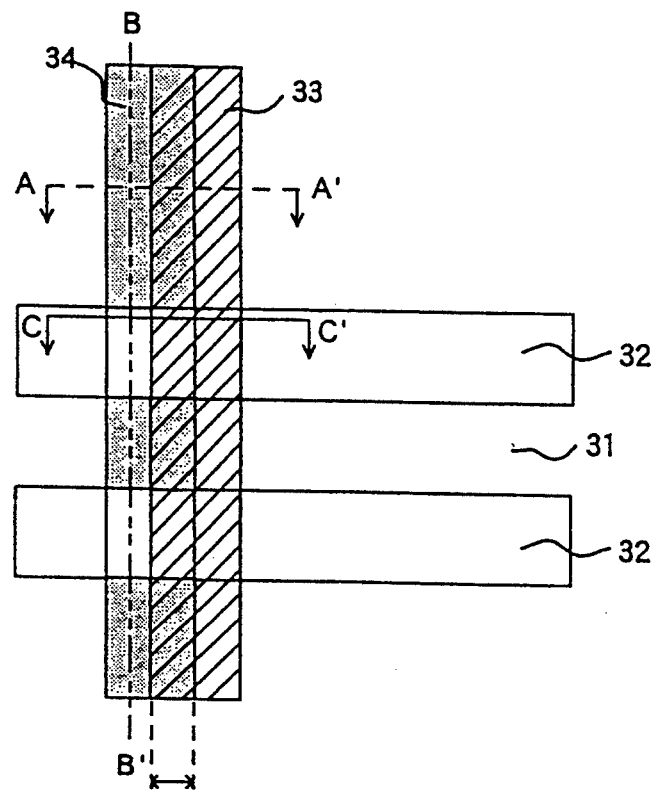
FIG. 13 is a schematic plan view of still another conventional semiconductor device.
Figure 14:
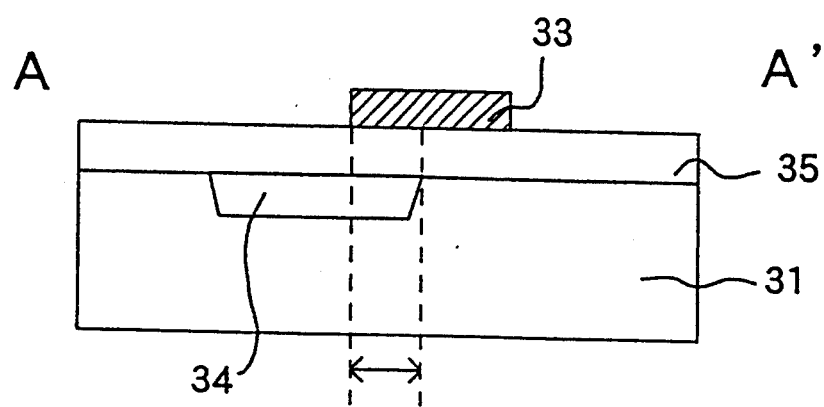
FIG. 14 is a cross sectional view taken along line A—A' of FIG. 13.
Figure 15:
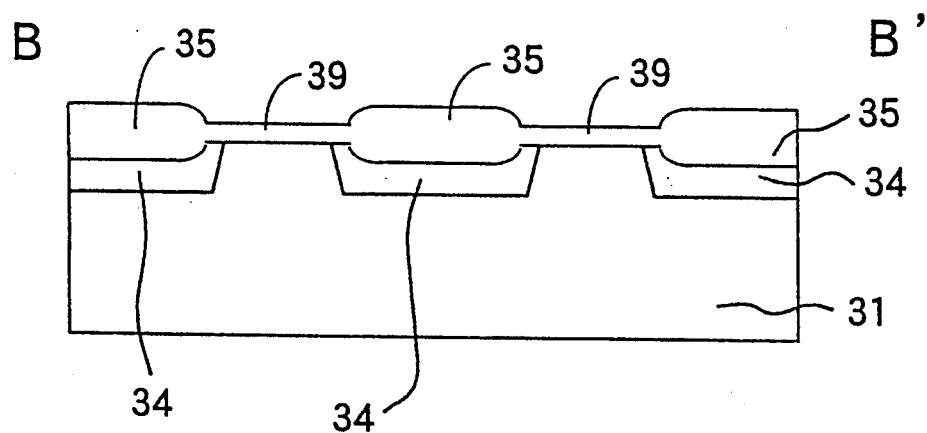
FIG. 15 is a cross sectional view taken along line B—B' of FIG. 13.
Figure 16:
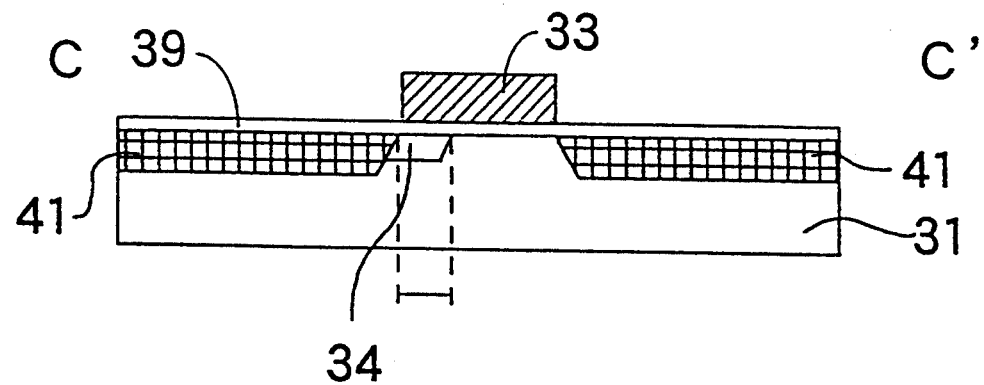
FIG. 16 is a cross sectional view taken along line C—C' of FIG. 13.

According to the present invention, as shown in FIGS. 1 and 7, even when the buried diffusion layer 6 and the gate electrode 10 are provided so as to overlap with each other seen from the top, the buried diffusion layer 6 and the channel region 12 under the gate electrode 10 are constantly in an offset state. Accordingly, the buried diffusion layer 6 is not formed in a channel region of a transistor as shown in FIG. 8.

Figure 6:
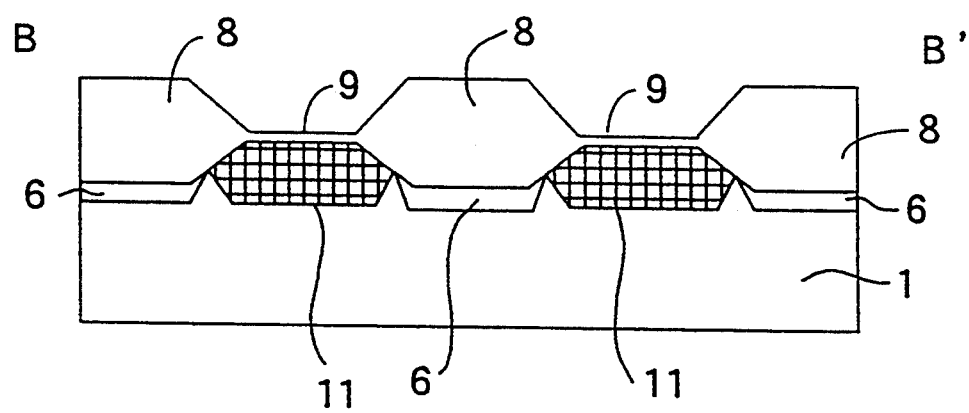
FIG. 6 is a cross sectional view of a semiconductor device according to the present invention, which is taken along line B—B' of FIG. 1.

Moreover, the buried diffusion layer 6 and the source/drain region 11 can be connected with each other as shown in FIG. 6. The buried diffusion region 6 can be formed under the device isolation film 8 and inside the bird's beak.

Alternatively, in case that the side wall spacer of an insulating film is formed on the side wall of the anti-oxide film after removing the anti-oxide film on the field oxide film formation region, the width of offset can be prevented from reducing, which is caused by the further miniaturization of the size of a device.

Further, if P and As ions are doubly implanted as the implantation of ions of the second conductive type for forming the source/drain region, the width of offset can be made wide, so that the buried diffusion layer 6 and the source/drain region 11 can be connected with each other, whereby the processing condition would be made with ease.

Therefore, retaining the alignment margin between the gate electrode 10 and the buried diffusion layer 6 is not necessitated, so that further minimization of memory cell and maximization of capacity of a device can be realized.

What is claimed is:

1. A method for forming a semiconductor device comprising steps of:
   (i) depositing an oxide film and then an anti-oxide film on a semiconductor substrate of a first conductivity type,
   (ii) removing the anti-oxide film provided in a prescribed region where a field oxide film is to be formed, followed by forming a resist on the semiconductor substrate including the anti-oxide film in a prescribed region where a buried diffusion layer is to be formed,
   (iii) implanting ions of a second conductivity type to the semiconductor substrate using the anti-oxide film and the resist as a mask,
   (iv) forming the field oxide film in the prescribed region by LOCOS (local oxidation of silicon) method, followed by forming a gate electrode on the semiconductor substrate,
   (v) implanting ions of a second conductivity type to the semiconductor substrate using the gate electrode as a mask and subjecting the resulting semiconductor substrate to a thermal treatment, thereby forming a source/drain to which the buried diffusion layer is ohmically connected.

2. A method for forming a semiconductor device according to claim 1, wherein a side wall spacer of an insulating film is formed on the side wall of the anti-oxide film after removing the anti-oxide film provided on the prescribed region where the field oxide film is to be formed in step (ii).

3. A method for forming a semiconductor device according to claim 1, wherein the implantation of ions of the second conductive type for forming the source/drain in step (v) is a double implantation of phosphorus and arsenic ions.

4. A method for forming a semiconductor device according to claim 1, wherein the ions are implanted at the dose of about $1 \times 10^{14}$ to $1 \times 10^{16}$ ions/cm$^2$ in step (iii).

5. A method for forming a semiconductor device according to claim 1, wherein a further thermal treatment is performed between step (iii) and (iv).

6. A method for forming a semiconductor device according to claim 5, wherein the further thermal treatment is performed at about 800° C. to 1,000° C.

7. A method for forming a semiconductor device according to claim 1, wherein the semiconductor device constitutes a memory device and the buried diffusion layer is a bit line.

* * * * *